(12) United States Patent
Price

(10) Patent No.: US 6,736,361 B2
(45) Date of Patent: May 18, 2004

(54) SEMICONDUCTOR WAFER POSITIONING SYSTEM AND METHOD

(75) Inventor: John H. Price, Austin, TX (US)

(73) Assignee: nLine Corporation, Austin, TX (US)

( * ) Notice: Subject to any disclaimer, the term of this patent is extended or adjusted under 35 U.S.C. 154(b) by 54 days.

(21) Appl. No.: 09/945,917

(22) Filed: Sep. 4, 2001

(65) Prior Publication Data
US 2003/0042381 A1 Mar. 6, 2003

(51) Int. Cl.[7] ................................................ A47F 5/00
(52) U.S. Cl. ..................... 248/288.51; 248/288.51; 248/694; 356/399; 310/317; 310/318
(58) Field of Search ........................ 248/288.51, 694, 248/637, 651, 676, 678; 310/317, 328; 356/399

(56) References Cited

U.S. PATENT DOCUMENTS

| 4,087,715 | A |   | 5/1978  | Myer ........................ 310/317 |
| 4,583,847 | A | * | 4/1986  | Battig et al. ................... 355/53 |
| 4,727,278 | A |   | 2/1988  | Staufenberg, Jr. et al. .. 310/328 |
| 4,785,189 | A | * | 11/1988 | Wells ........................ 250/492.2 |
| 4,837,445 | A |   | 6/1989  | Nishioka et al. ......... 250/442.1 |
| 4,937,618 | A |   | 6/1990  | Ayata et al. .................. 355/43 |
| 5,159,486 | A | * | 10/1992 | Webb ........................ 359/299 |
| 5,220,408 | A |   | 6/1993  | Mager ........................ 356/372 |
| 5,303,035 | A |   | 4/1994  | Luecke et al. ............... 356/399 |
| 5,478,698 | A | * | 12/1995 | Rostoker et al. ............ 430/296 |
| 5,530,253 | A |   | 6/1996  | Nishioka et al. ....... 250/442.11 |
| 5,823,906 | A | * | 10/1998 | Ashburn et al. ............ 475/164 |
| 5,903,085 | A |   | 5/1999  | Karam ........................ 310/328 |
| 5,912,527 | A | * | 6/1999  | Karrai ........................ 310/328 |
| 5,999,268 | A |   | 12/1999 | Yonezawa et al. .......... 356/399 |
| 6,078,392 | A |   | 6/2000  | Thomas et al. ............. 356/348 |
| 6,111,706 | A | * | 8/2000  | Incera et al. ................. 359/822 |
| 6,118,540 | A |   | 9/2000  | Roy et al. ................... 356/394 |
| 6,408,526 | B1 | * | 6/2002 | Montesanti et al. ......... 33/1 M |
| 6,409,453 | B1 | * | 6/2002 | Brodine et al. ............. 414/941 |
| 6,437,463 | B1 | * | 8/2002 | Hazelton et al. ............... 310/12 |

FOREIGN PATENT DOCUMENTS

| JP | 07/122218 | 5/1995 | ............ H01J/37/20 |
| JP | 07297241 | 11/1995 | ............ H01L/21/66 |
| WO | WO 93/22616 | 11/1993 | ............ G01B/11/00 |

OTHER PUBLICATIONS

Product Catalog for Piezosystem Jena, pp. 8 and 9, date unknown.

* cited by examiner

Primary Examiner—Kimberly Wood
(74) Attorney, Agent, or Firm—Baker Botts L.L.P.

(57) ABSTRACT

The present invention discloses a positioning system that includes at least three positioner assemblies. Each positioner assembly includes a housing with a coarse adjustment assembly and a fine adjustment assembly disposed within the housing. The positioner assemblies are releasably coupled to a wafer chuck and operable to selectively position the chuck. More particularly, the fine adjustment assembly includes a piezoelectric actuator that is selectively movable between a retracted position and an extended position.

20 Claims, 4 Drawing Sheets

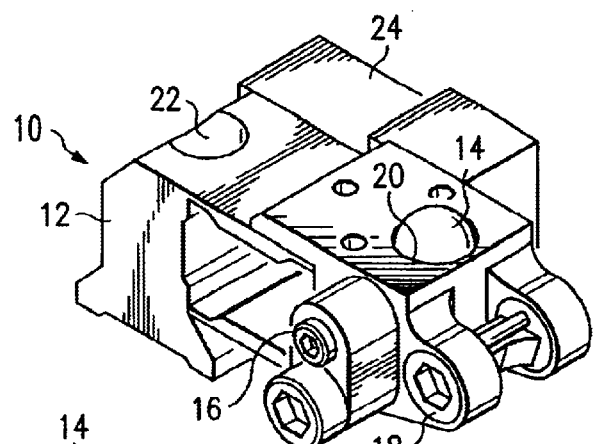
FIG. 1A
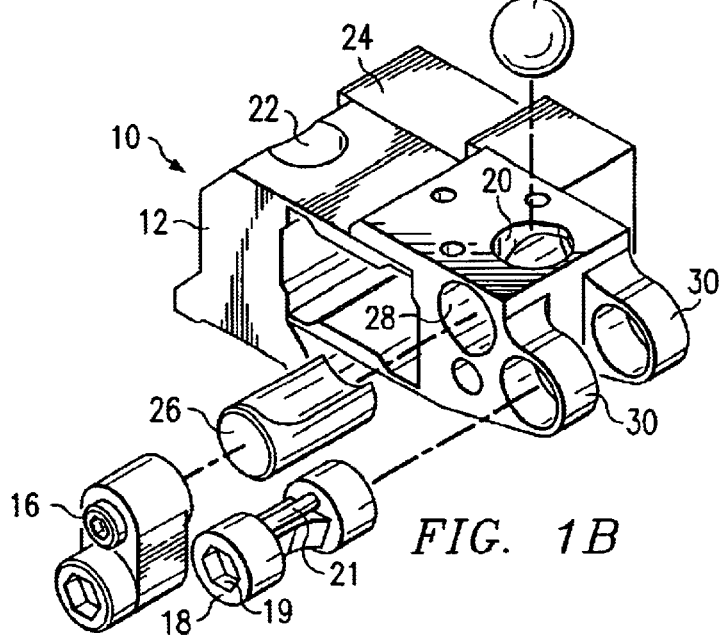
FIG. 1B
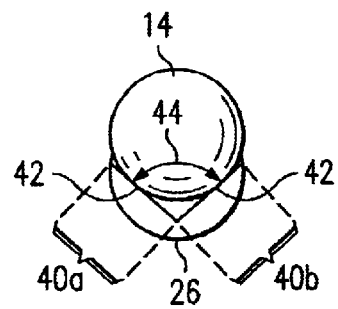
FIG. 1D
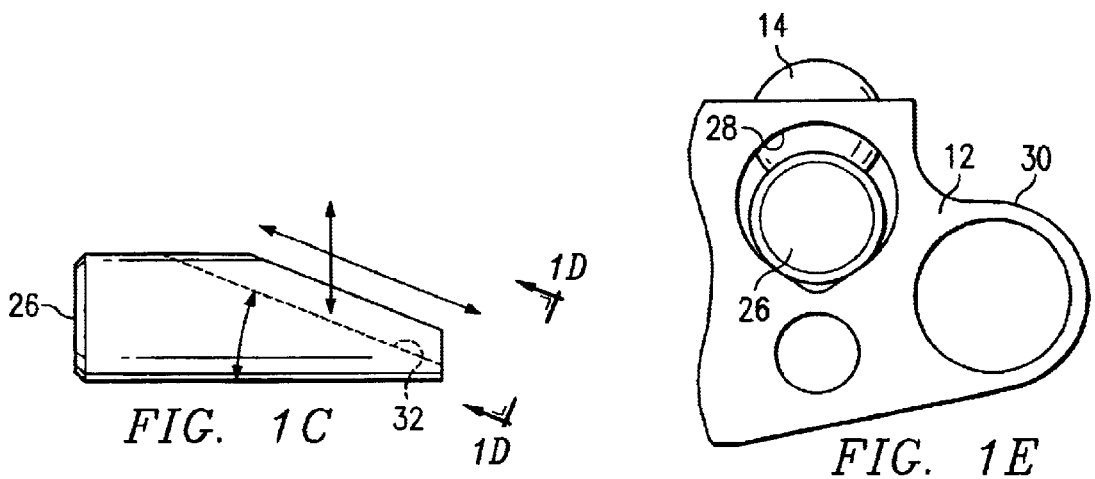
FIG. 1C
FIG. 1E

SEMICONDUCTOR WAFER POSITIONING SYSTEM AND METHOD

TECHNICAL FIELD

The following invention relates in general to the field of positioning systems and more specifically to positioning systems for semiconductor testing and inspection systems.

BACKGROUND

Semiconductor manufacturing and testing often requires precise positioning of semiconductor wafers with respect to manufacturing or testing equipment. Positioning systems are often used to move and hold semiconductor wafers in proximity to testing or manufacturing equipment. Optical scanning or imaging techniques often involve scanning very small portions of a semiconductor wafer and then combining all of the scanned portions to obtain an image of the entire wafer. Such a technique typically requires moving either the wafer or the imaging device to obtain each individual image. In this type of testing, precise positioning of a semiconductor wafer with respect to a testing device is particularly important.

As a general matter, as semiconductor manufacturing techniques have advanced, devices on semiconductor wafers have become increasingly small. As device sizes decrease, accurately inspecting the devices becomes increasingly difficult. Also, as semiconductor devices decrease in size, the density of devices within a given area of a semiconductor wafer increases. Accordingly, in order to inspect the same number of wafers in a given period of time, an inspection system often must record a greater number of measurements. Often, this requires a positioning system to move more frequently in order to inspect the increased number of devices in a shortened period of time. Increased movement of the inspection system can lead to a number of difficulties related to dynamic forces acting on a positioning system affecting the accuracy and efficiency of the semiconductor testing system.

Another consideration in any semiconductor manufacturing process is that any slowdown or bottleneck within the process can be extremely costly. Routine maintenance operations such as equipment adjustment or replacement may cause significant delay, consuming the valuable time of skilled technicians and interrupting a semiconductor manufacturing process. Such an interruption can be extremely costly, negatively effecting throughput.

Semiconductor inspection systems, particularly systems that inspect systems optically, are often sensitive to inaccuracies in wafer positioning. If wafers that are being tested are not positioned correctly, testing may be ineffective and lead to erroneous results. Inaccurate positioning may also lead to difficulties in assembling multiple images of portions of a wafer into a single, useful, image of an entire wafer.

SUMMARY

Therefore, a need has arisen for a positioning system that facilitates the accurate positioning of wafers for inspection and testing.

A further need has arisen for a positioning system that facilitates frequent movement of a wafer.

A still further need has arisen for a positioning system that facilitates maintenance and removal operations.

In accordance with teachings of the present disclosure, a system and method are described for positioning a wafer within an inspection system that reduces the problems associated with prior systems and methods for positioning wafers.

The present invention discloses a positioning system that includes at least three positioner assemblies. Each positioner assembly includes a housing with a coarse adjustment assembly and a fine adjustment assembly disposed within the housing. The positioner assemblies are releasably coupled to a wafer chuck and operable to selectively position the chuck. More particularly, the fine adjustment assembly includes a piezoelectric actuator that is selectively movable between a retracted position and an extended position.

The coarse adjustment assemblies may include a spherical ball disposed within the housing adjacent to the wafer chuck. The spherical ball may move vertically to selectively position the wafer chuck. A plunger may be disposed within the housing adjacent the spherical ball and be selectively positionable by an adjustment screw.

The system may also include a locking spring that interfaces with the wafer chuck and the housing such that the locking spring loads the interface between the wafer chuck and housing. An over-center spring tensioner may be disposed within the housing to selectively interface a portion of the locking spring and selectively load the locking spring.

The present invention provides a number of important technical advantages. One technical advantage is providing positioner assemblies with coarse adjustment and fine adjustment assemblies. The positioner assemblies facilitate accurate positioning of a wafer secured on the wafer chuck.

Another important technical advantage is providing a locking spring that loads the interface between the housing and the wafer chuck. The loading interface allows the wafer chuck to maintain stability during frequent movement.

Another important technical advantage of the present invention is providing an over-center spring tensioner for interfacing the locking spring. Providing the over-center spring tensioner facilitates the removal of the wafer chuck for maintenance or replacement.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 1A is a perspective view of a positioner assembly according to one embodiment of the present invention;

FIG. 1B is an assembly view of a positioner assembly according to the present invention;

FIG. 1C is a side view of a plunger according to the present invention;

FIG. 1D is an end view of a ball and plunger according to the present invention;

FIG. 1E is an end view of a positioner assembly housing with portions removed;

DETAILED DESCRIPTION

Figure 1F:
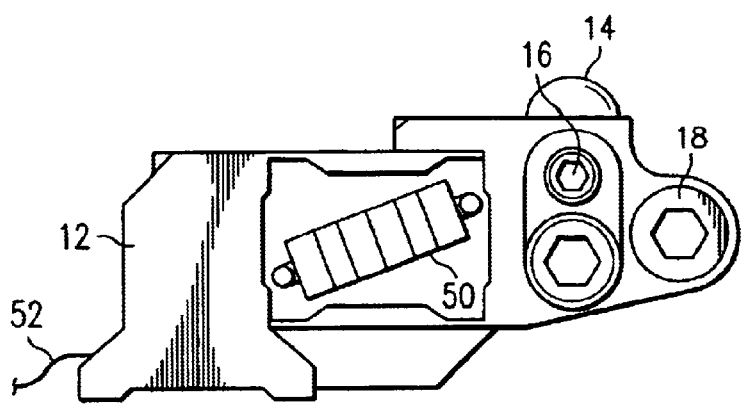
FIG. 1F is a side view of a positioner assembly showing a piezoelectric actuator.
Figure 2:
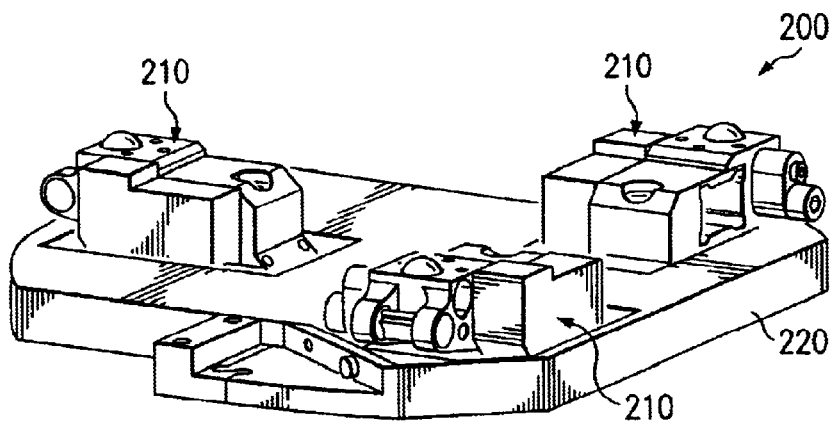
FIG. 2 is a perspective view of three positioner assemblies.

Preferred embodiments and their advantages are best understood by reference to FIGS. 1 through 3, wherein like numbers are used to indicate like and corresponding parts.

FIG. 1A is a perspective view of a positioner assembly, indicated generally at 10, according to one embodiment of the present invention. Positioner assembly 10 includes ball 14 disposed within housing 12. More specifically, ball 14 is preferably disposed within asymmetric bore 20. Ball 14 may be selectively positioned by adjustment screw 16 associated with a plunger (as shown in FIG. 1B). In a preferred embodiment adjustment screw 16 may be a fine pitch screw. In a particular embodiment, the rotation of adjustment screw 16 approximately five degrees results in an approximately two micrometer vertical displacement of ball 14. Ball 14, adjustment screw 16 (and the related positioner) and the portions of housing 12 in which they operate constitute a coarse adjustment assembly.

Housing 12 may be formed by using EDM manufacturing method and further includes bore 22 for attaching housing 12 to a selectively movable base (as shown in FIG. 2). Housing 12 also includes over-center spring tensioner 18. Positioner assembly 12 further includes sensor 24 disposed adjacent housing 12. In a preferred embodiment, sensor 24 may be a capacitive displacement sensor. Sensor 24 is preferably operable to detect movement of the positioner assembly.

FIG. 1B is an assembly view of positioner assembly 10. Positioner assembly 10 includes housing 12, ball 14, adjustment screw 16, over-center spring tensioner 18, asymmetric bore 20, bore 22, sensor 24, plunger 26, plunger bore 28, and shoulders 30.

Figure 3B:
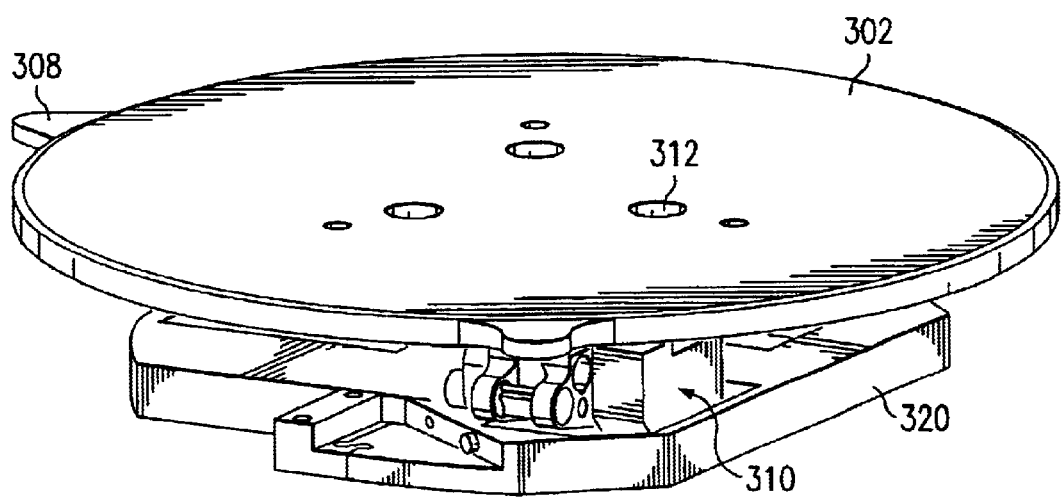
FIG. 3B is a perspective view of a wafer chuck and positioner system.
Figure 3A:
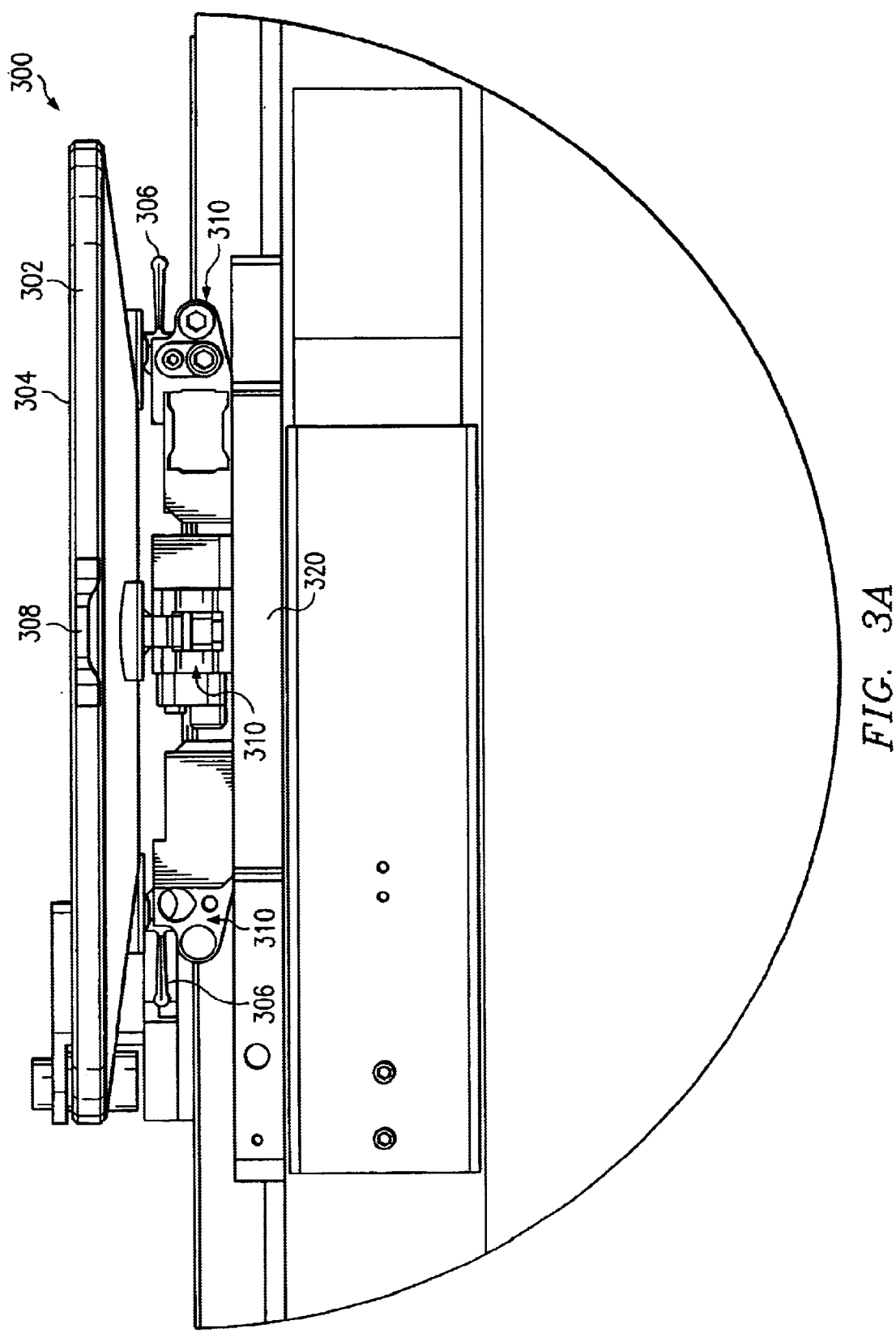
FIG. 3A is a side view of a wafer chuck and positioner system.

Adjustment screw 16 is preferably disposed adjacent to plunger 26; plunger 26 also interfaces ball 14. The interface between adjustment screw 16, plunger 26 and ball 14 are such that advancement of adjustment screw 16 advances plunger 26, resulting in the vertical displacement of ball 14. Ball 14 may comprise a hardened ball bearing or another suitable spherical ball. Ball 14 may further mate with a mounting feature on the base of a wafer chuck (as shown in FIGS. 3A and 3B). Housing 12 further includes shoulder portions 30 formed to receive over-center spring tensioner 18. Over-center spring tensioner 18, in the present embodiment includes a hex head 19 and a catch 21 formed to rotatably receive portions of a locking spring as shown in FIG. 3A.

FIG. 1C is a side view of a plunger according to the present invention. Plunger 26 includes groove 31 having slope 32.

FIG. 1D is an end view of a ball and plunger according to the present invention. Ball 14 rests on the interior groove 31 formed within plunger 26. Groove 31 includes two surfaces 40a and 40b for interfacing ball 14. Surfaces 40a and 40b each provide a single line of contact for ball 14 such that at any given position within groove 31, ball 14 contacts groove 31 of plunger 26 at two distinct points 42.

FIG. 1E is an end view of a positioner assembly housing 12 with portions removed according to the present invention. Positioner housing 12 includes asymmetric bore 28 formed to receive plunger 26 and ball 14. Housing 12 further includes shoulder 30 and mounting bore 27. Asymmetric bore 28 is formed to allow plunger to translate through asymmetric bore 28 along two lines of contact.

FIG. 1F is a side view of positioner assembly showing a piezoelectric actuator. Positioner assembly includes housing 12, ball 14, adjustment screw 16 and over-center spring tensioner 18. Housing 12 also contains piezoelectric actuator 50 disposed therein. In an alternative embodiment piezoelectric actuator 50 may be any suitable fine adjustment actuator. Piezoelectric actuator 50 and the portions of housing 12 with which it interacts constitute a fine adjustment assembly. In one particular embodiment, piezoelectric actuator 50 is a piezoelectric actuator such as a universal translator series PU translator manufactured by Piezosystem Jena. In this particular embodiment, piezoelectric actuator 50 is an activator consisting of a single part, allowing it to exhibit excellent mechanical stability. Further, in this particular embodiment, piezoelectric actuator 50 is preloaded such that it may operate dynamically. Piezoelectric actuator may be operatively connected to a power source via connection 52 and may further be remotely connected to a digital computer or another suitable computer system operable to selectively actuate piezoelectric actuator 50.

FIG. 2 is a perspective view of a positioner system indicated generally at 200. Positioner system 200 includes three positioner assemblies 210 disposed on base 220. Base 220 may be secured to an adjacent system (not expressly shown) operable to selectively position the base.

FIG. 3A is a side view of a wafer chuck and positioner system indicated generally at 300. Positioner system 300 includes positioner assemblies 310 and wafer chuck 302. Wafer chuck 302 is preferably interfaced with positioner assemblies 310 via locking spring 306. Wafer chuck 302 further includes alignment and reference tabs 308.

FIG. 3B is a perspective view of a wafer chuck and positioner system. Positioner system 300 includes wafer chuck 302 with wafer chuck tabs 308. Wafer chuck 302 in the present embodiment is preferably coupled to positioner assembly 310 via locking springs 306 (as shown in FIG. 3A). Wafer chuck 302 further includes vacuum ports 312 for securing wafers to wafer chuck 302. In the present embodiment, wafer chuck 302 is preferably approximately 300 mm in diameter and has a monocock construction.

In operation positioner system 300 may be used with an optical scanning system. In one particular embodiment, positioner system 200 may be used in conjunction with an optical scanning system that incorporates direct to digital holography (DDH) techniques as described in U.S. Pat. No. 6,078,392 entitled, Direct-to-digital Holography and Holovision by Thomas et al. which is incorporated herein by reference.

Figure 4:
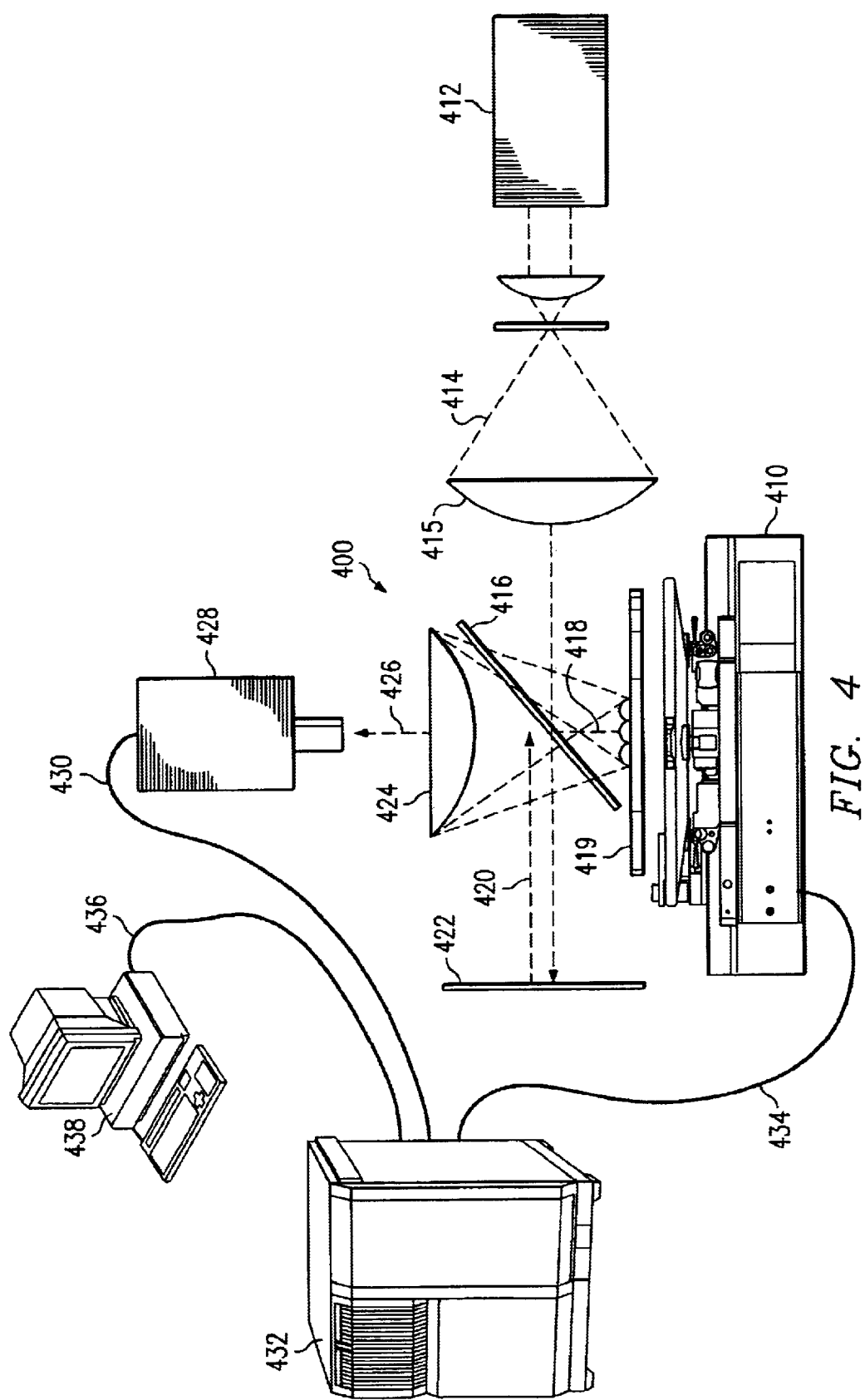
FIG. 4 shows a positioner assembly used with an optical inspection system.

FIG. 4 shows positioner system 410 used in conjunction with an optical inspection system indicated generally at 400. Inspection system 400 includes laser 412 directed at beam expansion filter 414 and lens 415. After passing through lens 415, a laser beam from laser 412 is directed to beam splitter 416.

Beam splitter 416 may be, for example, 50% reflective. Beam splitter 416 reflects object beam 418 towards wafer 419 mounted on positioner system 410. Object beam 418 then reflects off of wafer 419. Beam splitter allows reference beam 420 to advance to mirror 422 and reflected back to beam splitter 416. Reference beam 420 and object beam 418 are then focused by focusing lens 270 and are directed to charged coupled device (CCD) camera 428.

CCD camera 428 is operably connected to computer system 432 via connection 430. Computer 432 is also operably connected to positioner system 410 via connection 434 and to workstation 438 via connection 436. In operation, CCD Camera 428 captures both object beam 418 and reference beam 420 as digital information and transmits this information to computer 432 for storage and/or processing. Workstation 438 may also be used to access the information captured by CCD Camera 428. Further workstation 438 may also be used to selectively position Wafer 419 using positioner system 410. More specifically, work station 438 may also be used to operate the fine adjustment assemblies (as shown in FIG. 1F) with positioner system 410 to position wafer 419 with respect to CCD camera.

In operation, wafer 419 may be secured to the wafer chuck surface using vacuum ports (as shown in FIG. 3B). Wafer 419 may then be selectively positioned manually by operating the coarse adjustment assembly, particularly by rotating adjustment screw 16 to selectively raise or lower one or more balls 14 (as shown in FIG. 1A). In a particular embodiment, rotation of adjustment screw 16 approximately five degrees results in an approximately two micrometer displacement of ball 14. After coarse adjustments have been made to the position of wafer 419 with respect to CCD camera 428, workstation 438 and computer 432 may be used to further adjust the position of wafer 419 with respect to CCD camera 428 using the fine adjustment assemblies of positioner system 410. This fine adjustment process may be performed by manual operation of workstation 438 or by software.

Further, during maintenance or other operation which requires the removal of wafer chuck 302 (as shown in FIG. 3B), over-center spring tensioners may be rotated to release locking springs 306 (as shown in FIG. 3A) and thereby release wafer chuck 302. When replacement of wafer chuck 302 is required, over-center spring tensioner may be rotated such that catch portions 21 engage locking springs 306. Further rotation of spring tensioner 18 loads locking springs 306, thereby securing wafer chuck 302 to positioner assemblies 10 (as shown in FIG. 3A).

Although the present invention and its advantages have been described in detail, it should be understood that various changes, substitutions and alterations can be made herein without departing from the spirit and scope of the invention as defined by the following claims.

What is claimed is:

1. A positioning system comprising:
   at least three positioner assemblies wherein each positioner assembly comprises:
   a housing;
   a coarse adjustment assembly disposed within the housing; and
   a fine adjustment assembly disposed within the housing;
   the at least three positioner assemblies releasably coupled to a wafer chuck, the positioner assemblies operable to selectively position the chuck.

2. The system of claim 1 wherein each fine adjustment assembly further comprises a piezoelectric actuator selectively movable between a retracted position and an extended position.

3. The system of claim 2 wherein each of the at least three coarse adjustment assemblies further comprises:
   a spherical ball disposed within the housing adjacent to the wafer chuck operable to move substantially vertically between a first position and a second position;
   a plunger disposed within the housing and formed to interface with the ball such that horizontal advancement of the plunger between a first position and a second position advances the ball from the first position to the second position; and
   an adjustment screw coupled to the plunger operable to selectively advance or retract the plunger.

4. The system of claim 3 wherein the plunger further comprises two inclined planes formed to interface with the ball.

5. The system of claim 4 further comprising the two inclined planes offset by approximately ninety degrees.

6. The system of claim 3 wherein the adjustment screw further comprises a fine pitch type screw.

7. The system of claim 3 further comprising the plunger, ball, and adjustment screw formed such that a five degree turn of the adjustment screw advances the ball approximately two micrometers.

8. The system of claim 3 further comprising a locking spring interfaced with the wafer chuck and the housing such that the locking spring loads the wafer chuck and housing interface.

9. The system of claim 8 further comprising an over-center spring tensioner disposed within the housing movable between an open position and a locked position, the over-center spring tensioner formed to selectively interface a portion of the locking spring and selectively loading the over-center spring tensioner.

10. The system of claim 1 wherein the wafer chuck further comprises a monocock structure.

11. A positioner assembly comprising:
    a housing;
    a fine adjustment assembly disposed within the housing;
    a coarse adjustment assembly disposed within the housing, the coarse adjustment comprising a ball disposed within the housing and a plunger assembly interfacing with the ball such that lateral advancement of the plunger assembly interacts causing vertical displace of the ball; and
    an over-center spring tensioner disposed within two shoulders extending from the housing, selectively movable between an open position and a locked position, the over-center spring tensioner operable to selectively engage a portion of a locking spring during movement of the over-center spring tension from the open position to the locked position.

12. The system of claim 11 further comprising the housing formed using an EDM technique.

13. The system of claim 11 wherein the fine adjustment assembly further comprises a piezoelectric actuator disposed within the housing.

14. The system of claim 13 further comprising a selectively adjustable power source coupled to the piezoelectric actuator.

15. The system of claim 11 wherein the coarse adjustment assembly further comprises
    an adjustment screw coupled to the plunger operable to selectively advance or retract the plunger.

16. The system of claim 11 further comprising a locking spring interfaced with a wafer chuck and the housing such that the locking spring loads the wafer chuck and housing interface.

17. The system of claim 16 further comprising an over-center spring tensioner disposed within the housing operable to selectively interface a portion of the locking spring and selectively load the over-center spring tensioner.

18. A method for positioning a wafer chuck comprising:
    selectively positioning the wafer chuck by selectively adjusting at least a first coarse adjustment assembly housed within a positioner assembly; and
    selectively positioning the wafer chuck by selectively adjusting at least a first fine adjustment assembly housed within the positioner assembly.

19. The method of claim 18 wherein selectively positioning the wafer chuck further comprises positioning the wafer chuck with respect to a CCD camera.

20. A method for positioning a wafer chuck comprising:
   selectively positioning the wafer chuck by selectively adjusting at least a first coarse adjustment assembly housed within a positioner assembly;
   selectively positioning the wafer chuck by selectively adjusting at least a first fine adjustment assembly housed within the positioner assembly; and
   securing the wafer chuck to the positioner assembly with an over-center spring tensioner.

* * * * *